United States Patent [19]
Brenner et al.

[11] Patent Number: 6,115,403
[45] Date of Patent: Sep. 5, 2000

[54] DIRECTLY MODULATED SEMICONDUCTOR LASER HAVING REDUCED CHIRP

[75] Inventors: Tomas Brenner; Jean-Luc Archambault, both of Severna Park, Md.

[73] Assignee: CIENA Corporation, Linthicum, Md.

[21] Appl. No.: 08/898,710

[22] Filed: Jul. 22, 1997

[51] Int. Cl.$^7$ ............................. H01S 3/08; H04B 10/04
[52] U.S. Cl. ............................. 372/102; 372/20; 372/28; 372/6; 385/37; 359/182
[58] Field of Search ............................. 372/20, 25, 26, 372/28, 32, 102, 6; 385/10, 37; 359/182, 187, 188, 114, 130, 161, 341

[56] References Cited

U.S. PATENT DOCUMENTS

| | | | |
|---|---|---|---|
| 5,077,816 | 12/1991 | Glomb et al. | 385/37 |
| 5,299,212 | 3/1994 | Koch et al. | 372/32 |
| 5,416,629 | 5/1995 | Huber | 359/182 |
| 5,434,702 | 7/1995 | Byron | 385/10 |
| 5,633,885 | 5/1997 | Galvanauskas et al. | 372/25 |
| 5,696,859 | 12/1997 | Onaka et al. | 385/24 |
| 5,715,265 | 2/1998 | Epworth | 372/20 |
| 5,717,799 | 2/1998 | Robinson | 385/37 |
| 5,740,292 | 4/1998 | Strasser | 385/37 |
| 5,742,714 | 4/1998 | Byron | 385/37 |

FOREIGN PATENT DOCUMENTS 9707577 2/1997 WIPO .

OTHER PUBLICATIONS

P.A. Morton et al., "38.5 km Error Free Transmission At 10 Gbit/s . . . " Electronics Letters, vol. 33 No. 4, pp. 310–311, Feb. 13, 1997.

K. Sugden et al., "Fabrication of high rejection, low loss, filters by the concatenation of broadly chirped fibre Bragg gratings", SPIE vol. 2998, pp. 22–28.

McCadams et al., CLEO'97, Paper CThW6, pp. 447–448.

Woodward et al., *IEEE Photonics Technology Letters,* vol. 5, No. 6, Jun. 1993, pp. 628–630.

Lee et al., CLEO'95, Paper Ctu10, pp. 93–94.

Morton et al., OFC'96 Technical Digest, Paper T4H6, pp. 39–40.

*Primary Examiner*—Hemang Sanghavi
*Attorney, Agent, or Firm*—David L. Soltz

[57] ABSTRACT

In accordance with the present invention, an in-line fiber Bragg grating is coupled to the output of a directly modulated DFB laser. The grating preferably rejects chirp induced frequencies of light emitted by the DFB laser. Accordingly, light transmitted through the grating is spectrally narrowed and has a higher extinction ratio, thereby decreasing bit error rate probabilities.

13 Claims, 5 Drawing Sheets

DIRECTLY MODULATED SEMICONDUCTOR LASER HAVING REDUCED CHIRP

FIELD OF THE INVENTION

This application is related to copending application entitled "Laser Wavelength Control Under Direct Modulation", incorporated herein by reference.

The present invention is directed to a system and related method for narrowing a spectrally broadened output of a directly modulated laser.

Optical communication systems are a substantial and fast growing constituent of communication networks. In a typical optical communication system, information bearing optical signals are transmitted along an optical fiber. The optical signals are frequently generated by operating a laser in a continuous-wave (CW) mode, and modulating the emitted light with an external modulator, such as a Mach-Zehnder interferometer. Although such external modulation schemes effectively encode the optical signals with communication data, the external modulator is expensive and inserts additional loss into the system. Such loss, however, can be compensated in long haul networks with optical amplifiers, which further add to the cost of the system.

Shorter haul networks, however, are more cost sensitive than long haul networks. Accordingly, in order to reduce the cost of these networks, semiconductor distributed feedback (DFB) directly modulated lasers have been proposed. These lasers are turned on and off directly in accordance with the communication data, thereby eliminating the need for an external modulator. Further, since DFB lasers can generate a high power optical output, few, if any, optical amplifiers are required.

When the DFB laser is in the "on" state, however, a relatively large current is injected into the semiconductor laser, while in the "off" state a relative low current is injected and a small amount of light is output. Such changes in current result in corresponding changes in the carrier density within the laser, which, in turn, alter output frequency and spectrally broaden or "chirp" the emitted light.

As shown in FIG. 1, the optical spectrum of a directly modulated semiconductor laser has a main intensity peak 101 at the intended channel frequency. The optical spectrum, however, is spectrally broadened to include a subsidiary peak 102 at chirp-induced frequencies lower than the channel frequency.

The chirped signal includes relatively significant "blue" (higher frequency at peak 101) and "red" (lower frequency at peak 102) components, which can propagate through an optical fiber at different speeds due to chromatic dispersion. Accordingly, light from one pulse can overlap with a successive pulse at the receiving end of an optical fiber causing increased bit error rate probabilities. Directly modulated lasers therefore limit the distance of short haul optical communication systems.

SUMMARY OF THE INVENTION

Consistent with the present invention, an optical device is provided which comprises a semiconductor laser configured to be coupled to a first end portion of an optical communication path, and a drive circuit coupled to the semiconductor laser. The drive circuit supplies an electrical signal to directly modulate the semiconductor laser.

The optical device further includes an optical receiver configured to be coupled to a second end portion of the optical communication path to thereby receive the light emitted by said semiconductor laser. In addition, an in-line fiber Bragg grating is provided in the optical communication path. The in-line fiber Bragg grating is spaced a first distance from the first end portion of the optical communication path and a second distance from the second end portion of the optical communication path, such that the first distance is less than said second distance. Moreover, the in-line fiber Bragg grating is provided in an in-transmission configuration to substantially reject chirp-induced frequencies.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION

In accordance with the present invention, an in-line fiber Bragg grating is coupled to the output of a directly modulated DFB laser. The grating preferably rejects chirp induced frequencies of light emitted by the DFB laser. Accordingly, light transmitted through the grating is spectrally narrowed has a higher extinction ratio and narrower spectrum. Accordingly, lower bit error rate probabilities can be achieved.

Figure 1:
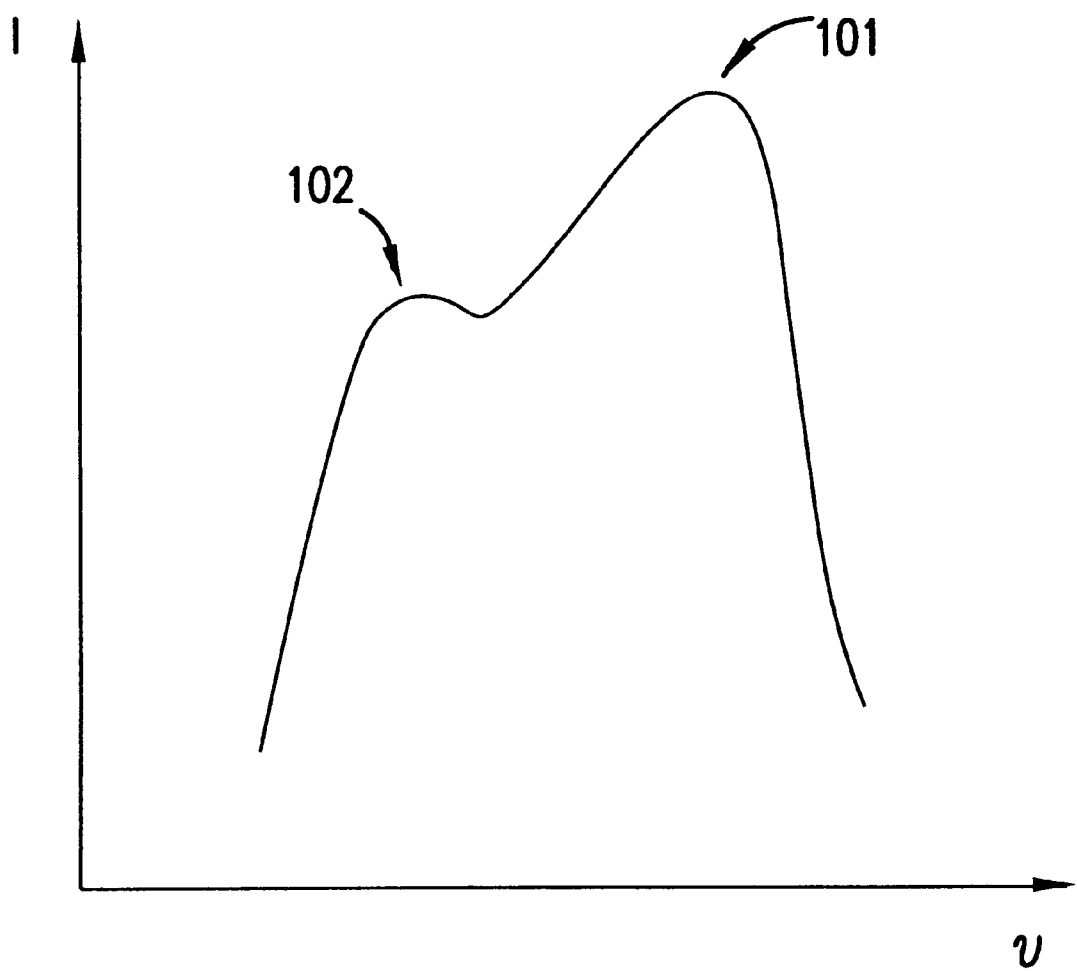
FIG. 1 illustrates an optical spectrum of a conventional directly modulated DFB laser.
Figure 2:
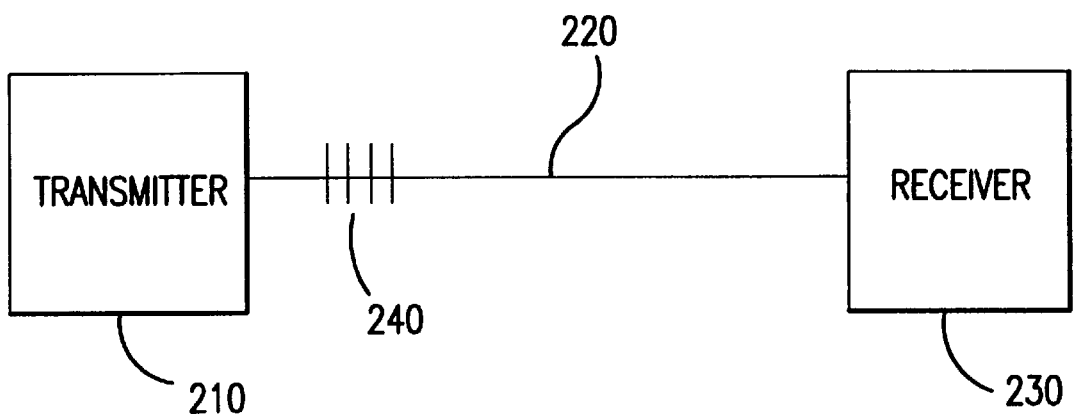
FIG. 2 illustrates a simplified schematic diagram of an optical communication system in accordance with the present invention.

Turning to the drawings in which like reference characters indicate the same or similar elements in each of the several views, FIG. 2 illustrates a simplified schematic diagram of an optical communication system in accordance with the present invention. The optical communication system includes transmitter 210 coupled to an optical communication path, such as an optical fiber 220, which supplies optical communication signals to receiver 230. As generally understood, receiver 230 can include photodiodes (not shown) for sensing the optical signals and other appropriate circuitry. As further shown in FIG. 2, optical fiber 220 includes in-line fiber Bragg grating 240 provided in an "in transmission" configuration. That is, light transmitted through the grating is passed to receiver 230, while reflected light is rejected. In-line fiber Bragg grating 240 is commercially available from Sumitomo Electric Industries, Ltd. and 3M Specialty Optical Fibers, for example.

It is understood that combiners, couplers, star distribution networks, switching elements, optical amplifiers, signal regenerators, reconditioners, add/drop multiplexers, and repeaters and the like may be present in the optical communication system and coupled to the optical communication path without any loss of generality of applicability for the principles of the present invention.

Figure 3:
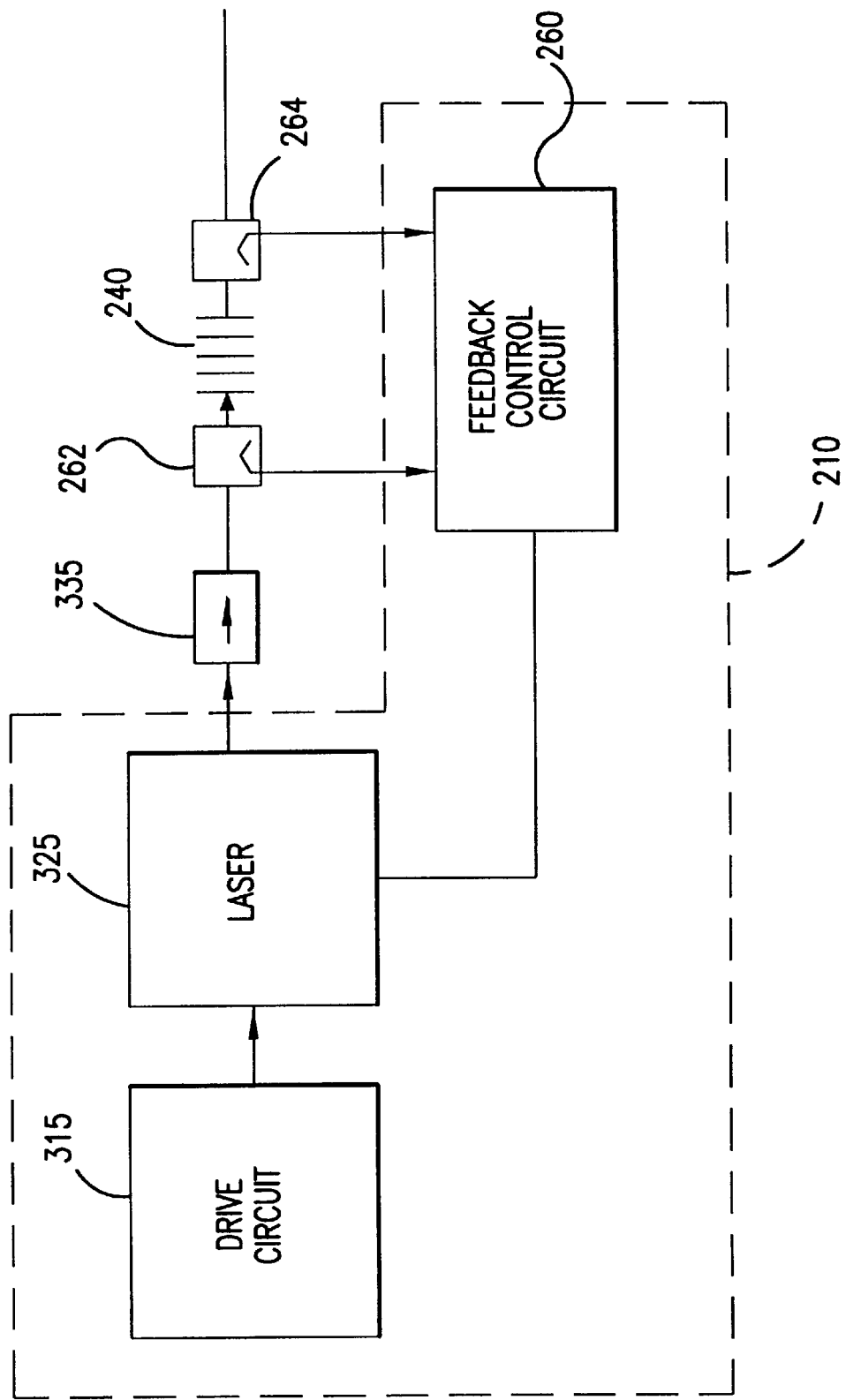
FIG. 3 illustrates a detailed schematic of a transmitter and associated in-line fiber Bragg grating in accordance with an aspect of the present invention.

Transmitter 210 is shown in greater detail in FIG. 3. Transmitter 210 typically includes a drive circuit 315 that turns laser 325 "on" and "off" to transmit communication data as a series of optical pulses on optical communication path 220. Laser 325 is typically a DFB laser generally comprising III–V semiconductor materials and commercially available from a wide variety of suppliers such as Fujitsu, Alcatel, Lucent and Hewlett-Packard.

Figure 4:
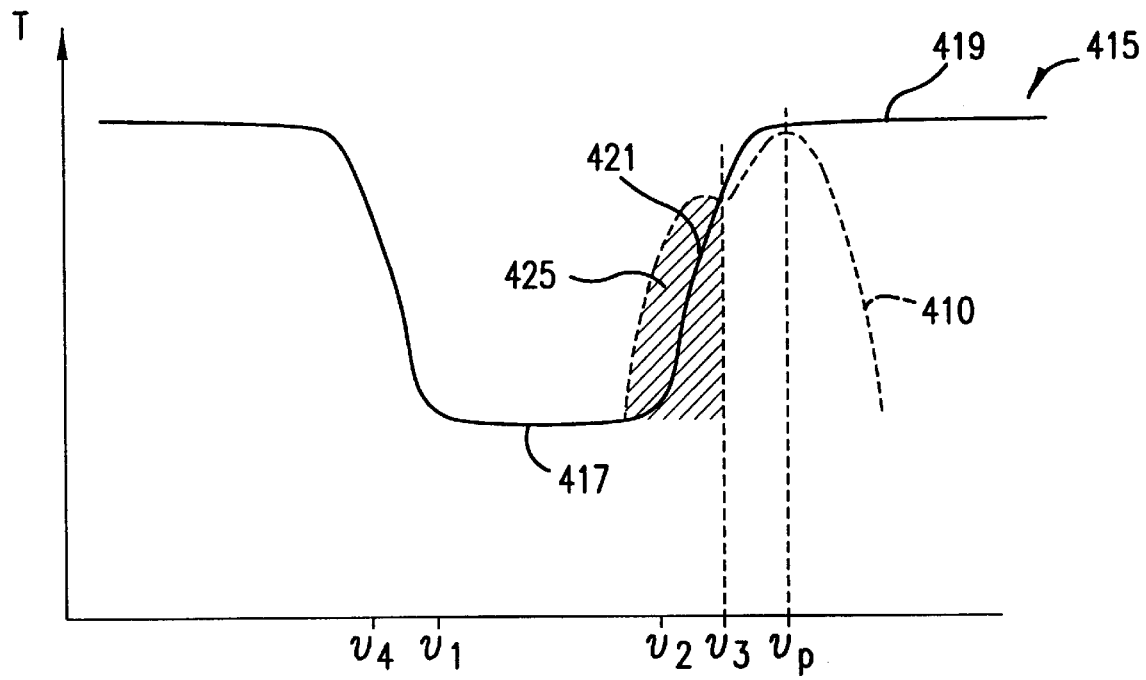
FIG. 4 illustrates a transmissivity characteristic of an in-line fiber Bragg grating and optical spectrum of a directly modulated DFB laser in accordance with an aspect of the present invention.

As seen in FIG. 4, output spectrum 410 of directly modulated laser 325 is superimposed on transmissivity characteristic 415 of in-line fiber Bragg grating 240. Typically, transmissivity characteristic 415 has a low transmissivity over a first range of frequencies substantially between $v_1$ and $v_2$, a high transmissivity segment 419 over a second range of frequencies greater than or equal to $v_3$, and an intermediate portion 421 having a relatively steep slope typically at least 1 dB/GHz and preferably 2–5 dB/GHz or more over a relatively narrow range of frequencies between $v_2$ and $v_3$. The transmissivity characteristic has an additional transmission maximum over frequencies less than $v_4$.

As further shown in FIG. 4, in-fiber Bragg grating 240, in the in-transmission configuration, is preferably designed so that chirp-induced frequencies, represented by the cross-hatched area 425 beneath optical spectrum curve 410, typically fall within reduced-transmission portions of the transmissivity characteristic, for example, between $v_1$ and $v_3$. Typically, the difference in frequency between $v_1$ and $v_3$ is about 40 GHz. Moreover, this portion of the transmissivity characteristic preferably has a loss greater than 3 dB, and is typically greater than 10 dB.

Figure 5:
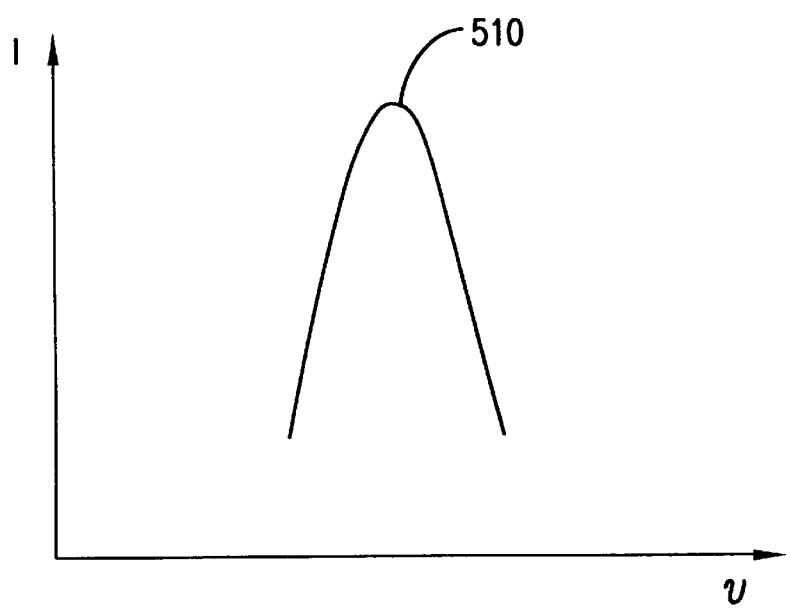
FIG. 5 illustrates an optical spectrum generated in accordance with the present invention.

The grating is further designed so that the peak optical power frequency $v_P$ is greater than $v_3$. As a result, the chirp-induced frequencies of light emitted by laser 325 are substantially rejected by grating 240, while the channel frequency, i.e., $v_P$, is transmitted. As shown in FIG. 5, the resulting spectrum of light transmitted to receiver 230 has a single intensity peak 510 at channel frequency $v_P$, is narrowed significantly, and is substantially free of the chirp-induced frequencies. Typically, in order to insure that modulation induced sidebands of the transmitted signal, not shown in FIG. 5, are not rejected by grating 240, the grating is typically designed to have a low loss (i.e., high transmissivity) over a range of frequencies $v_P \pm v_{mod}$, where $v_{mod}$ is the modulation frequency of laser 325. The loss is preferably less than 1 dB and is typically less than 0.1 dB.

Moreover, the ratio of transmitted light in the on-state to transmitted light in the off-state (the "extinction ratio") can be achieved with the present invention with a smaller current swing than that required by a conventional directly modulated DFB laser. As noted above, current is continuously supplied to the laser in both the on and off states, although the on-current is necessarily significantly more than the off-current. In the conventional directly modulated laser, the off-current must be diminished substantially to a current slightly above the threshold current of the laser in order to insure that the combined amounts of intended channel light and the chirp light is sufficiently low. Consistent with the present invention, however, the chirped light is rejected by in-line fiber Bragg grating 240, and, therefore, a sufficiently low light intensity can be achieved even at higher off-currents. As a result, the off-current need not be diminished to the same extent as in the conventional directly modulated scheme, and smaller on-to-off current swings can be tolerated, thereby requiring a simpler laser driver circuit. Conversely, the same swing of the laser could yield a higher extinction ratio.

Improved bit error rates (BER) associated with the present invention will now be discussed with reference to FIG. 6, which illustrates log(BER) as a function of received optical power from a directly modulated DFB laser. Curves 810 and 820 represent BER characteristics of conventional directly modulated DFB lasers. In particular, curve 810 corresponds to the BER of optical signals received over 107 km of fiber having a dispersion of 17 ps/nm/km, and curve 820 represents the BER of optical signals detected adjacent the laser output (i.e., in, a "back-to-back" configuration). Curves 830 and 840, however, correspond to BER characteristics of optical signals transmitted in accordance with the present invention: over 107 km of the fiber (curve 830) and detected directly at the output of the grating in the back-to-back configuration (curve 840) due to the higher extinction ratio.

Figure 6:
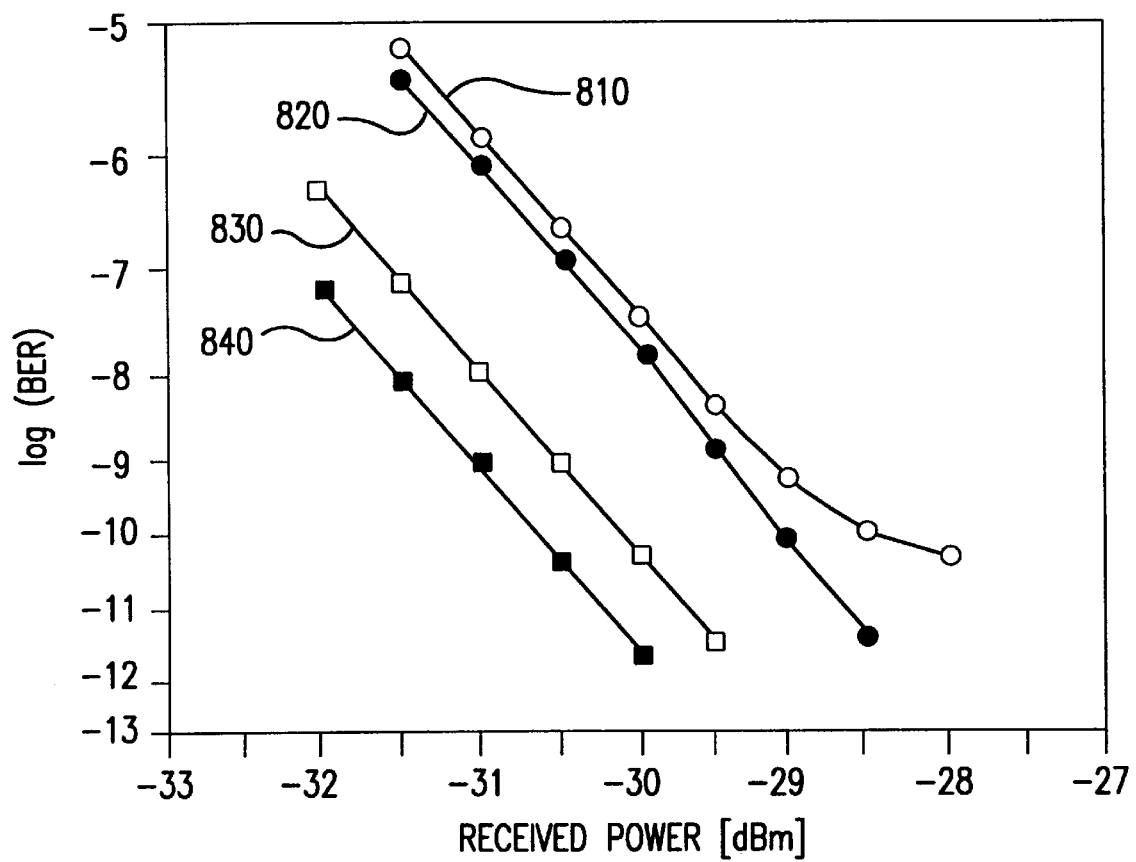
FIG. 6 illustrates bit error rate plots achieved in accordance with the present invention and obtained with conventional directly modulated DFB lasers.

As further seen in FIG. 6, for any given level of received optical power, the BER associated with the present invention is significantly lower than that of the conventional directly modulated laser. Moreover, the BER of optical signals transmitted in accordance with the present invention over 107 km of fiber, which may have been expected to be relatively high, is actually reduced considerably, and is even lower than the BER of a conventional directly modulated laser measured in the back-to-back configuration.

Returning to FIG. 3, by providing in-line fiber Bragg grating 240 closer to transmitter 210 than receiver 230, for example within 3.0 meters from the output of laser 325, a feedback control circuit 260 can be provided in transmitter 210 for regulating the frequency of light output from laser 325 in accordance with the intermediate portion 421 or "edge" of the transmissivity characteristic of in-line fiber Bragg grating 240. Preferably, the difference between $v_1$ and $v_2$ should be relatively large, typically at least 40 GHz, in order to insure that the frequency is adjusted to the appropriate edge of in-line fiber Bragg grating 240

Feedback control circuit 260 can include photodetectors (not shown) for sensing light reflected by grating 240 via coupler 262 and light transmitted through grating 240 via coupler 264. Electrical signals generated by these photodetectors can then be used to adjust the frequency of laser 325, for example, in a manner similar to that described in the above cited patent application. In addition, a back facet monitoring photodiode (not shown) may be provided adjacent a read facet of laser 325 to monitor optical power output.

It is further noted that light can be reflected by grating 240 back to laser 325, thereby degrading performance of the laser. Accordingly, as further shown in FIG. 3, an optical isolator 335 is typically provided between the output of laser 325 and in-line fiber Bragg grating 240 in order to prevent any reflected light from reaching laser 325.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. An optical device, comprising:
   a semiconductor laser configured to be coupled to a first end portion of an optical communication path;
   a drive circuit coupled to said semiconductor laser, said drive circuit supplying an electrical signal to said semiconductor laser to hereby emit light in a directly modulated fashion;

an optical receiver configured to be coupled to a second end portion of said optical communication path to thereby receive said light emitted by said semiconductor laser; and an in-line fiber Bragg grating provided in said optical communication path, said in-line fiber Bragg grating being provided in an in-transmission configuration with an optical output of said semiconductor laser, said in-line fiber Bragg grating being spaced a first distance from said first end portion of said optical communication path and a second distance from said second end portion of said optical communication path, said first distance being less than said second distance, said in-line fiber Bragg grating being configured to substantially reject chirp-induced frequencies of said light, and said in-line fiber Bragg grating has a transmissivity characteristic, said transmissivity characteristic having a first transmissivity over a first range of frequencies and a second transmissivity, greater than said first transmissivity, over a second range of frequencies, said first range of frequencies having a magnitude at least equal to 40 GHz.

2. An optical device in accordance with claim 1, wherein said in-line fiber Bragg grating has a transmission characteristic as a function of optical frequency, said transmission characteristic having a first segment having a first transmissivity, a second segment having a second transmissivity greater than said first transmissivity and a third segment between said first and second segments, said third segment having a slope at least equal to 1dB/GHz.

3. An optical device in accordance with claim 1, further comprising:

an optical isolator provided in said optical communication path, said optical isolator being positioned between said first end portion of said optical communication path and said in-fiber Bragg grating.

4. An optical device in accordance with claim 1, wherein said light having a peak optical power at a peak frequency, said in-line fiber Bragg grating having a loss less than 1 dB at said peak frequency.

5. An optical device in accordance with claim 1, wherein said in-line fiber Bragg grating having a loss greater than 10 dB at said chirp-induced frequencies.

6. An optical device in accordance with claim 1, wherein said in-line fiber Bragg grating having a loss exceeding 3 dB over a range of frequencies, said range of frequencies having a magnitude of 40 GHz.

7. An optical device, comprising:

a semiconductor laser;

a drive circuit coupled to said semiconductor laser, said drive circuit supplying an electrical signal to said semiconductor laser to thereby emit light in a directly modulated fashion;

an optical receiver configured to receive a portion of said light emitted by said semiconductor laser;

an optical coupler coupled to said semiconductor laser; and a fiber Bragg grating coupled to said optical coupler, said fiber Bragg grating being configured to substantially reject chirp-induced frequencies of said light emitted by said semiconductor laser, said fiber Bragg grating has a transmissivity characteristic, said transmissivity characteristic having a first transmissivity over a first range of frequencies and a second transmissivity, greater than said first transmissivity, over a second range of frequencies, said first range of frequencies having a magnitude at least equal to 40 GHz.

8. An optical device in accordance with claim 7, wherein said fiber Bragg grating has a transmission characteristic as a function of optical frequency, said transmission characteristic having a first segment having a first transmissivity, a second segment having a second transmissivity greater than said first transmissivity and a third segment between said first and second segments, said third segment having a slope at least equal to 1 dB/GHz.

9. An optical device in accordance with claim 7, further comprising:

an optical isolator coupled to said optical coupler and said fiber Bragg grating.

10. An optical device in accordance with claim 7, wherein said light having a peak optical power at a peak frequency, said fiber Bragg grating having a loss less than 1 dB at said peak frequency.

11. An optical device in accordance with claim 7, wherein said fiber Bragg grating having a loss greater than 10 dB at said chirp-induced frequencies.

12. An optical device in accordance with claim 7, wherein said fiber Bragg grating having a loss exceeding 3 dB over a range of frequencies, said range of frequencies having a magnitude of 40 GHz.

13. An optical device, comprising:

a semiconductor laser;

a drive circuit coupled to said semiconductor laser, said drive circuit supplying an electrical signal to said semiconductor laser to thereby emit light in a directly modulated fashion;

an optical receiver configured to receive a portion of said light emitted by said semiconductor laser; and a fiber Bragg grating coupled to an optical coupler, said fiber Bragg grating being configured to substantially reject chirp-induced frequencies of said light emitted by said semiconductor laser, said fiber Bragg grating having a transmission characteristic as a function of optical frequency, said transmission characteristic having a first segment having a first transmissivity, a second segment having a second transmissivity greater than said first transmissivity and a third segment between said first and second segments, said third segment having a slope with a magnitude at least equal to 1 dB/GHz.

* * * * *